United States Patent
Jung et al.

(10) Patent No.: US 7,992,291 B2
(45) Date of Patent: Aug. 9, 2011

(54) METHOD OF MANUFACTURING A CIRCUIT BOARD

(75) Inventors: Hoe-Ku Jung, Daejeon (KR);
Je-Gwang Yoo, Yongin-si (KR);
Myung-Sam Kang, Suwon-si (KR);
Ji-Eun Kim, Gwangmyeong-si (KR);
Jeong-Woo Park, Suwon-si (KR);
Jung-Hyun Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 941 days.

(21) Appl. No.: 11/976,070

(22) Filed: Oct. 19, 2007

(65) Prior Publication Data

US 2008/0101045 A1   May 1, 2008

(30) Foreign Application Priority Data

Oct. 30, 2006   (KR) .......................... 10-2006-0105923

(51) Int. Cl.
*H05K 3/20* (2006.01)
*H05K 1/18* (2006.01)

(52) U.S. Cl. ................ 29/831; 29/830; 29/840; 29/846; 29/852; 361/761

(58) Field of Classification Search ..................... 29/830, 29/831, 832, 843, 846, 852, 840; 361/761, 361/760, 795, 778; 438/622, 643, 655, 653; 174/264, 263

See application file for complete search history.

(56) References Cited

U.S. PATENT DOCUMENTS

| 4,855,872 A | * | 8/1989 | Wojnar et al. | 361/792 |
| 4,866,841 A | * | 9/1989 | Hubbard | 29/845 |
| 5,873,161 A | * | 2/1999 | Chen et al. | 29/830 |
| 2004/0192023 A1 | * | 9/2004 | Lee et al. | 438/622 |

FOREIGN PATENT DOCUMENTS

| JP | 10-84186 | 3/1998 |
| JP | 10-154766 | 6/1998 |
| JP | 10-294339 | 11/1998 |

OTHER PUBLICATIONS

Japanese Office Action dated Jun. 23, 2009 and issued in corresponding Japanese Patent Application 2007-274364.

* cited by examiner

*Primary Examiner* — Derris H Banks
*Assistant Examiner* — Tai Nguyen

(57) ABSTRACT

A method of manufacturing a circuit board, which includes a bump pad on which a solder bump may be placed, may include forming a solder pad on a surface of a first carrier; forming a metal film, which covers the solder pad and which extends to a bump pad forming region; forming a circuit layer and a circuit pattern, which are electrically connected with the metal film, on a surface of the first carrier; pressing the first carrier and an insulator such that a surface of the first carrier and the insulator faces each other; and removing the first carrier. Utilizing this method, the amount of solder for the contacting of a flip chip can be adjusted, and solder can be filled inside the board, so that after installing a chip, the overall thickness of the package can be reduced.

8 Claims, 16 Drawing Sheets

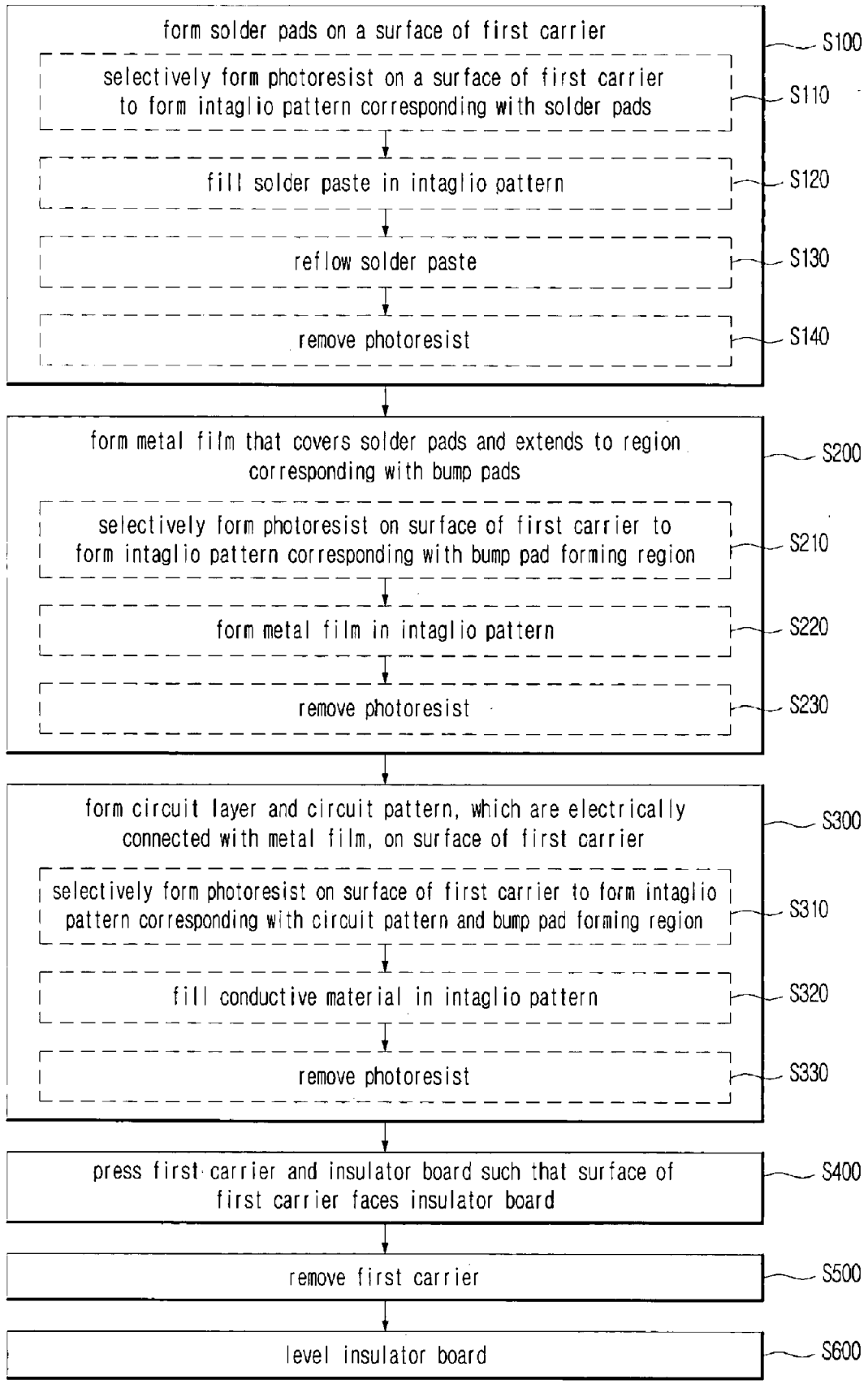

METHOD OF MANUFACTURING A CIRCUIT BOARD

CROSS-REFERENCE TO RELATED APPLICATIONS

This application claims the benefit of Korean Patent Application No. 10-2006-0105923 filed with the Korean Intellectual Property Office on Oct. 30, 2006, the disclosure of which is incorporated herein by reference in its entirety.

BACKGROUND

1. Technical Field

The present invention relates to a circuit board and a method of manufacturing the circuit board.

2. Description of the Related Art

With recent advances in the electronics industry, there is a growing demand for electronic components that provide higher performance, more functionality, and smaller sizes. In this context, there is also a demand for higher integration, lower thickness and finer circuit patterns on the board for surface-mounted components, such as in an SiP (system in package) or 3D package, etc. In particular, in surface mounting technology for mounting electronic components on a board, flip chip bonding is gradually replacing wire bonding as the preferred method for electrically connecting an electronic component with the board.

In flip chip bonding according to the related art, solder bumps are positioned between the flip chips and the board for electrical connection, where a coining operation may be performed on the solder bumps to ensure the reliability of electrical contact between the flip chips and the board. This coining operation, however, is a process performed for each unit, and thus entails a long lead time.

Also, when another solder bump is formed on the bump pad of the board onto which the solder bump of the flip chip is placed in order to ensure the reliability of electrical connection between the flip chip and the board, the overall thickness of the package may be increased after mounting the flip chip.

In addition, the circuit pattern formed on the board according to the related art may be exposed at the upper portion of the board, so that the overall height may be increased, and undercuts may occur at the attachment portions of the circuit pattern and board, so that the circuit may be peeled off from the board.

SUMMARY

An aspect of the invention is to invention is to provide a circuit board, and a method of manufacturing a circuit board, in which the circuit patterns and bump pads including solder pads are formed beforehand on a carrier and copied onto an insulator, to allow the bump pads and circuit patterns to be buried in the board and provide high-density circuit patterns and flat bump pads.

One aspect of the invention provides a circuit board, which includes an insulator that includes a groove, a circuit layer which fills a portion of the groove, a solder pad on the circuit layer which fills the remainder of the groove, and a circuit pattern which is electrically connected with the circuit layer and which is buried in the insulator such that a portion of the circuit pattern is exposed at a surface of the insulator.

The circuit pattern may be buried in either surface of the insulator.

A metal film may additionally be included between the circuit layer and the solder pad.

The circuit layer may be formed at a bottom of the groove and at a side wall of the groove extending from the bottom, and the metal film may be made to cover the circuit layer.

The solder pad may contain at least one of lead (Pb), gold (Au), and silver (Ag), while the metal film may contain at least one of gold (Au) and nickel (Ni).

Another aspect of the invention provides a method of manufacturing a circuit board that includes a bump pad on which a solder bump may be placed. The method may include forming a solder pad on a surface of a first carrier; forming a metal film, which covers the solder pad and which extends to a bump pad forming region; forming a circuit layer and a circuit pattern, which are electrically connected with the metal film, on a surface of the first carrier; pressing the first carrier and an insulator such that a surface of the first carrier and the insulator faces each other; and removing the first carrier.

An operation of leveling the insulator may additionally be included, after removing the first carrier.

Forming the solder pad may include selectively forming photoresist on a surface of the first carrier to form an intaglio pattern corresponding with the solder pad, filling solder paste in the intaglio pattern, reflowing the solder paste, and removing the photoresist.

Forming the metal film may include selectively forming photoresist on the first carrier to form an intaglio pattern corresponding with the bump pad forming region, forming a metal film in the intaglio pattern, and removing the photoresist.

Forming the circuit layer and the circuit pattern may include selectively forming photoresist on a surface of the first carrier to form an intaglio pattern corresponding with the circuit pattern and the bump pad forming region, filling solder paste in the intaglio pattern, and removing the photoresist.

Filling the solder paste in the intaglio pattern may be performed by electroplating.

Forming the solder pad may include forming a board pad on a surface of a second carrier, forming the circuit layer and the circuit pattern may include forming a circuit pattern electrically connected with the board pad on a surface of the second carrier, pressing the first carrier and the insulator may include pressing the first carrier and the second carrier onto either surface of the insulator such that a surface of the first carrier and a surface of the second carrier respectively face the insulator, and removing the first carrier may include removing the first carrier and the second carrier.

After removing the first carrier and the second carrier, additional operations of leveling either surface of the insulator, forming vias in the insulator, and coating solder resist on the surfaces of the insulator, may be included.

Additional aspects and advantages of the invention will be set forth in part in the description which follows, and in part will be obvious from the description, or may be learned by practice of the invention.

BRIEF DESCRIPTION OF THE DRAWINGS

FIG. 16 is a flowchart illustrating a method of manufacturing a circuit board according to an embodiment of the invention.

DETAILED DESCRIPTION

Figure 1:
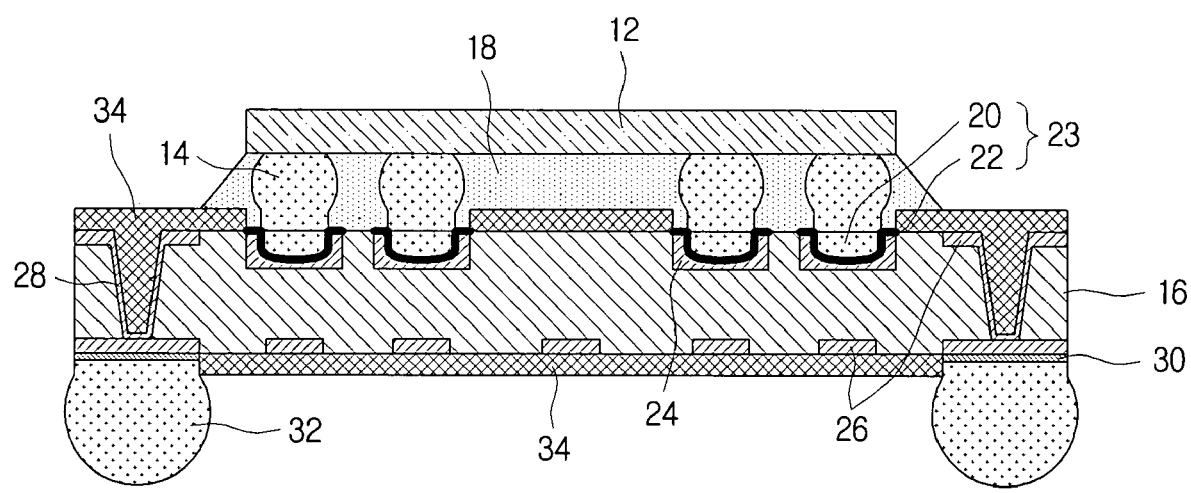
FIG. 1 is a cross-sectional view illustrating a circuit board having a mounted chip, according to an embodiment of the invention.

The circuit board and manufacturing method thereof, according to certain embodiments of the invention, will be described below in more detail with reference to the accompanying drawings, in which those components are rendered the same reference numeral that are the same or are in correspondence, regardless of the figure number, and redundant explanations are omitted.

FIG. 1 is a cross-sectional view illustrating a circuit board having a mounted chip, according to an embodiment of the invention. In FIG. 1 are illustrated a chip 12, solder bumps 14, an insulator 16, underfill 18, bump pads 23, board pads 30, solder pads 20, metal film 22, a circuit layer 24, a circuit pattern 26, solder balls 32, vias 28, and solder resist 34.

With the trend of electronic products towards providing higher integration, higher performance, and smaller sizes, the preferred method of connection between a semiconductor chip and a circuit board is shifting from wire bonding to flip chip bonding.

Flip chip bonding involves electrically connecting a chip 12 with the circuit board using solder bumps 14, instead of metal wires. After applying underfill 18 to protect the solder bumps 14 from mechanical damage and the external environment, solder balls 32 may be attached onto the surface of the circuit board opposite the surface where the chip 12 is attached, for electrical connection with an external circuit board. This flip chip bonding allows a short electrical distance between the chip 12 and the circuit board to provide higher electrical speeds, and also makes it possible, in accordance with higher levels of integration, to arrange the solder bumps 14 in arrays to respond to the chip 12 having multiple pins.

The solder bumps 14 may be coupled to the metal pad (not shown) of the chip 12, while the solder bumps 14 coupled to the chip 12 may be coupled to bump pads 23 formed on the circuit board for electrical connection.

The connection between the solder bumps 14 and the bump pads 23 may include mounting the solder bumps 14 after aligning the solder bumps 14 with the bump pads 23, and then placing these in an oven for reflowing, so that the connection between the chip 12 and the circuit board may be implemented by the solder.

Whereas in the related art, metal pads made of nickel/gold plating were used as the bump pads 23, to connect the chip 12 and the circuit board by placing the solder bumps 14 on the metal pads, in this embodiment, bump pads 23 composed of solder pads 20 and metal film 22 are used to ensure the reliability of electrical contact. That is, the solder pads 20 are used that are made of the same material as for the solder bumps 14, so that the solder bumps 14 and solder pads 20 may be coupled better when the solder is fused during the reflow process. When the chip 12 and circuit board are coupled due to the coupling of the bump pads 23 and solder bumps 14, an underfill 18 may be applied to fill the space between the chip 12 and the circuit board and thus protect the solder, using an underfill material including epoxy, etc.

Next, solder balls 32 for electrically connecting with an external circuit board, etc., may be attached to surface of the circuit board opposite the surface where the chip 12 is mounted, to complete a semiconductor package. The solder balls 32 may be coupled to the board pads 30 formed on the circuit board, to form a plane arrangement for coupling with an external circuit board, thereby allowing higher levels of integration and greater numbers of pins.

A circuit board according to this embodiment may be composed of an insulator which includes grooves, a circuit layer 24 which fills a portion of the grooves, solder pads 20 on the circuit layer 24 which fill the remainder of the grooves, and a circuit pattern 26 which is electrically connected with the circuit layer and which is buried in the insulator 16 such that a portion is exposed at the surface of the insulator 16. The circuit pattern 26 may be buried each on both surfaces of the insulator 16.

To improve adhesion between the circuit layer 24 and the solder pads 20, a metal film 22 may be included between the circuit layer 24 and solder pads 20. A bump pad 23 may be composed of the solder pad 20 and metal film 22, and may be connected with the circuit pattern 26 by way of the circuit layer 24, when a solder bump 14 is mounted.

In particular, the circuit layer 24 may be formed at the bottom of a groove formed in the insulator 16 and may extend from the bottom to be formed on portions of the side walls of the groove. Here, the metal film 22 may be made to cover the circuit layer 24. That is, while it is possible to have the circuit layer 24 fill a portion of the groove formed in the insulator 16, stack a metal layer on, and have the solder pads 20 on the metal layer, instead, the circuit layer 24 may be formed on the bottom of the groove and on the side walls of the groove extending from the bottom, to thus form another smaller groove, with the metal film 22 covering the circuit layer 24 and solder filling the remainder of the groove, thereby forming a solder pad 20. Here, a portion of the metal film 22 and the solder pad 20 may be exposed at the insulator 16, where the exposed portion of the metal film 22 and the solder pad 20 form a bump pad 23, on which a solder bump 14 may be mounted.

The circuit layer 24 may be a part of the circuit pattern 26 of the insulator 16, and may be connected with the circuit pattern 26 to form an electrical connection with the chip 12 and the circuit pattern 26 of the insulator 16.

The solder pads 20 may be made of the same material as that of the solder bumps 14, and may include at least one of lead (Pb), gold (Au), and silver (Ag).

Also, the metal film 22 may be to protect the solder pads 20 and improve adhesion with the circuit layer 24, and may be made by plating gold (Au) or nickel (Ni), where it is also possible to form the metal film 22 by plating with nickel (Ni) and then plating again with gold (Au). Of course, it is also possible to place the solder pads 20 directly on the circuit layer 24 without using a metal film 22.

The circuit pattern 26 in a circuit board according to this embodiment may be buried in the insulator 16 such that a portion is exposed at the surface of the board. If the circuit pattern 26 is buried in the insulator 16, there may be greater adhesion between the circuit and the insulator 16 so that there may be less peeling, and the overall thickness of the circuit board may be reduced. In addition, as the circuit is buried inside the insulator 16, there may be greater evenness and easier heat release. Moreover, there may be less likelihood of bending occurring of the circuit board, and higher reliability with respect to ion migration between adjacent circuits.

FIG. 2, FIG. 3, FIG. 4, FIG. 5, FIG. 6, FIG. 7, FIG. 8, FIG. 9 and FIG. 10 represent a flow diagram illustrating a process of forming bump pads and a circuit pattern according to an embodiment of the invention. In FIG. 2 to FIG. 10 are illustrated solder paste 40, photosensitive material 35, photoresist 36, a seed layer 38, a first carrier 42, metal film 22, a circuit layer 24, solder pads 20, and a circuit pattern 26.

The method of forming the bump pads 23 and the circuit pattern 26 on the first carrier may include the operations of forming solder pads 20 on a surface of the first carrier 42, forming a metal film 22 that covers the solder pads 20 and extends to a region corresponding to the bump pads 23, and forming a circuit pattern 26 on a surface of the carrier that is electrically connected with the metal film 22.

Figure 2:
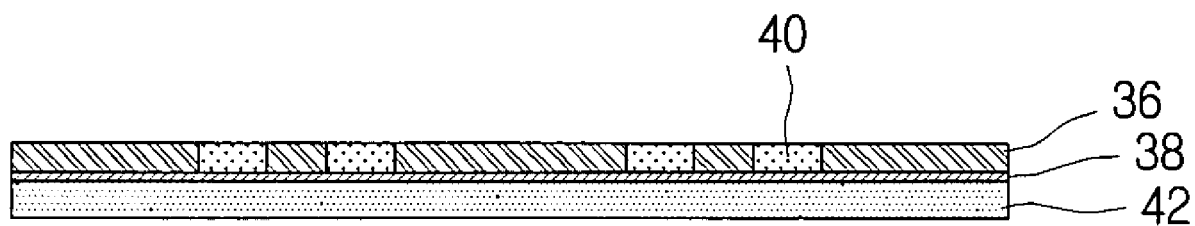
FIG. 2, FIG. 3, FIG. 4, FIG. 5, FIG. 6, FIG. 7, FIG. 8, FIG. 9 and FIG. 10 represent a flow diagram illustrating a process of forming bump pads and a circuit pattern according to an embodiment of the invention.
Figure 3:
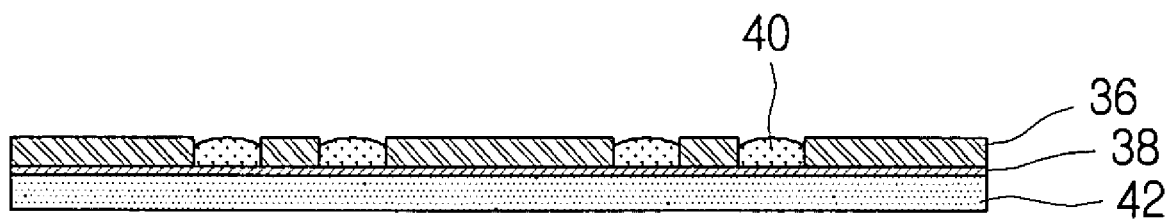

Forming the solder pads 20 on a surface of the first carrier 42 may include, with reference to drawings FIG. 2 and FIG. 3, selectively forming photoresist 36 on a surface of the first carrier 42 to form an intaglio pattern that is in correspondence with the solder pads 20, filling the intaglio pattern with solder paste 40, reflowing the solder paste 40, and then removing the photoresist 36, to form the solder pads 20.

The method of selectively forming photoresist 36 on a surface of the first carrier 42 to form an intaglio pattern may include first applying photosensitive material 35 on a surface of the first carrier 42 using existing equipment, fabricating a photomask in correspondence with the solder pad 20 region within the multiple bump pads 23 on which the solder bumps 14 are to be mounted, and afterwards stacking the photomask on the surface of the first carrier 42 coated with photosensitive material 35 and then exposing to ultraviolet rays. After the exposure, when the non-cured portions of the photosensitive material 35 are developed with developing liquid, an intaglio pattern may be formed that is in correspondence with the solder pad 20 forming region on the surface of the first carrier 42. The cured photosensitive material 35 that is not removed by the developing liquid may become the photoresist 36.

When the intaglio pattern is formed on the first carrier 42, it may be filled in with solder paste 40. For the method of filling solder paste 40 in the intaglio pattern, any method apparent to those skilled in the art may be used, such as filling in solder paste 40 using a blade, and filling in solder paste 40 ink using inkjet printing, etc. The solder paste 40 filled in the intaglio pattern may be made of the same material as that of the solder bumps 14, and may include at least one of lead (Pb), gold (Au), and silver (Ag).

Figure 4:
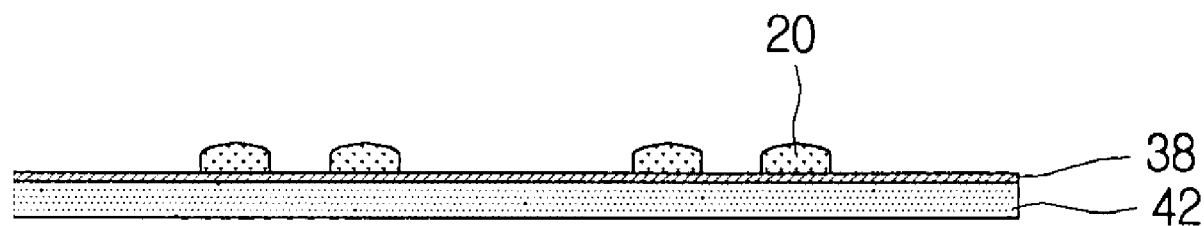

When the solder paste 40 is filled in, a reflow process may be performed for curing the solder paste 40. Here, the solder paste 40 may have a round form at the upper surface, due to surface tension. When the photoresist 36 is removed after the reflow process, the solder pads 20 may be completed on the surface of the first carrier, as illustrated in FIG. 4.

Figure 5:
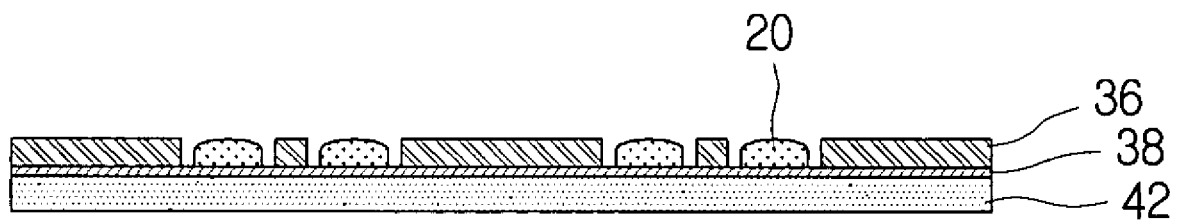
Figure 6:
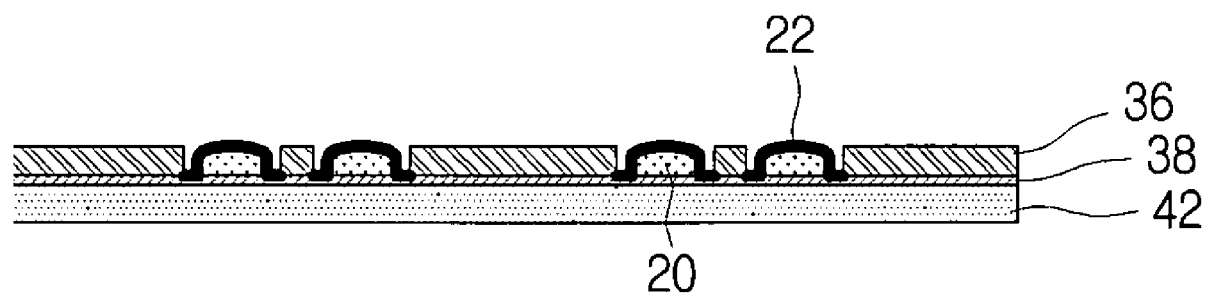
Figure 7:
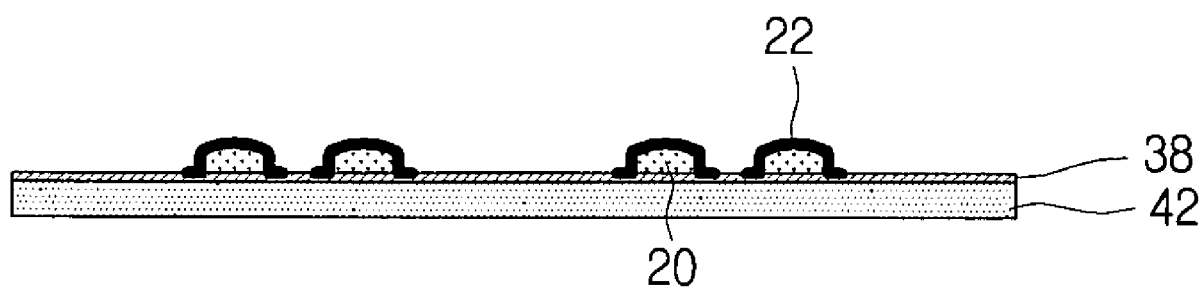

The method of forming the metal film 22 that covers the solder pads 20 and extends to a region corresponding to the bump pads 23 may include, as illustrated in FIG. 5, FIG. 6 and FIG. 7, selectively forming photoresist 36 on the first carrier 42, on which solder pads 20 are formed, to form an intaglio pattern that is in correspondence with the bump pad 23 forming region, forming the metal film 22 in the intaglio pattern, and then removing the photoresist 36.

In this embodiment, the bump pads 23 include the solder pads 20 and metal film 22, where the forming region of the bump pads 23 is greater than the solder pad 20 forming region. Thus, the metal film 22 may be formed such that covers the solder pads 20, between the solder pad 20 forming region and the bump pad 23 forming region. To this end, an intaglio pattern may be formed, which is greater than the intaglio pattern for forming the solder pads 20, on the surface of the first carrier 42 where the solder pads 20 are formed. That is, as illustrated in FIG. 5, the photoresist 36 may be formed on the surface of the first carrier 42 to form an intaglio pattern corresponding to the bump pad 23 forming region. When the intaglio pattern is formed, the metal film 22 may be formed for protecting the solder pads 20 as well as for improving adhesion with the circuit pattern 26 that is to be formed later.

A method apparent to those skilled in the art may be used for forming the metal film 22, such as plating by electroless plating and/or electroplating, filling with metal paste, applying metallic ink by inkjet printing, and sputtering, etc. A film made of gold (Au) or nickel (Ni) may be formed for the metal film 22, while it is also possible to first form the nickel and then form the gold again thereon.

In this particular embodiment, gold (Au) plating was performed to form the metal film 22. To perform the gold (Au) plating, a process of forming a seed layer 38 on the surface of the first carrier 42 may exist before forming the solder pads 20, and gold (Au) electroplating may be performed using this seed layer 38 as an electrode.

By forming the metal film 22 after forming the intaglio pattern corresponding to the bump pad 23 forming region that is greater than the intaglio pattern corresponding to the solder pad 20 forming region, the metal film 22 may be formed which covers the already formed solder pads 20 and which exists between the solder pad 20 forming region and the bump pad 23 forming region. Afterwards, the photoresist 36 used for forming the intaglio pattern corresponding to the bump pad 23 forming region may be removed.

In the case that the bump pad 23 forming region is equal to the solder pad 20 forming region, the photoresist 36 for forming the intaglio pattern corresponding with the solder pads 20 need not be removed, but may instead be used in forming the metal film 22 to just cover the solder pads 20. Furthermore, in the process of forming the circuit pattern 26, which will be described later, if the photoresist 36 for forming the intaglio pattern corresponding to the solder pads 20 are not removed but used again, it is also possible to manufacture a circuit board having a structure of the solder pads 20, metal film 22, and circuit pattern 26 stacked in order.

Figure 8:
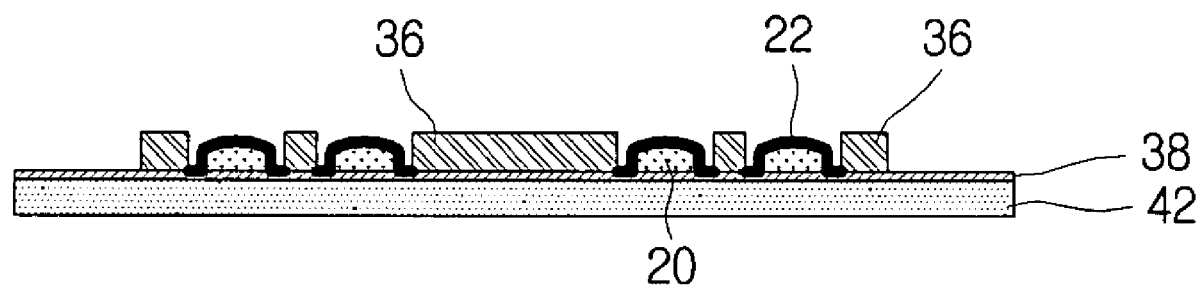
Figure 9:
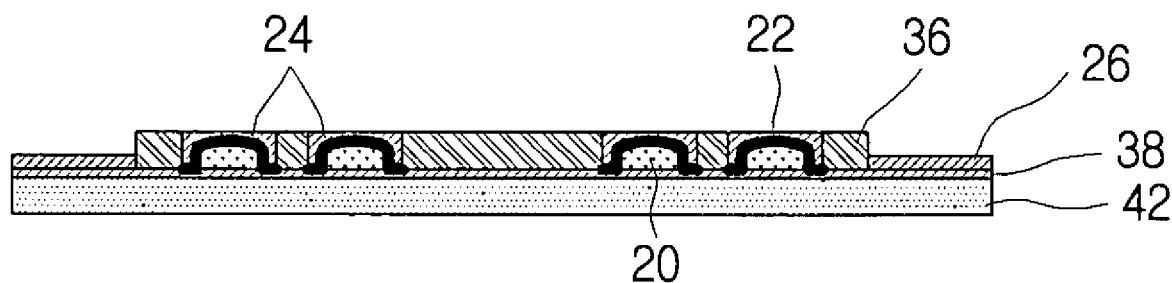
Figure 10:
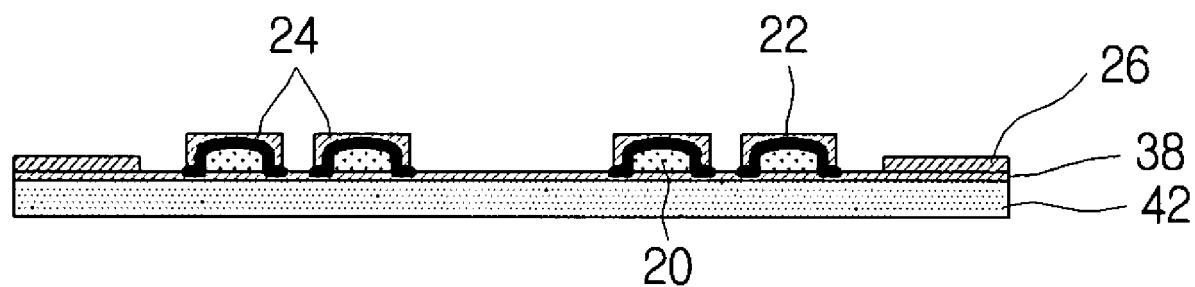

When the solder pads 20 and metal film 22 are formed, a circuit pattern 26 electrically connected with the metal film 22 may be formed, as illustrated in FIG. 8, FIG. 9 and FIG. 10. The method of forming the circuit pattern 26 may include selectively forming photoresist 36 on the surface of the first carrier 42 where the solder pads 20 and metal film 22 are formed to form an intaglio pattern corresponding to the circuit pattern 26 and bump pad 23 forming region, filling the intaglio pattern with conductive material, and then removing the photoresist 36.

The circuit layer 24 described above may be included in the circuit pattern 26. In other words, the circuit layer 24 may be a part of the circuit pattern 26 formed at one side of the bump pads 23, where the circuit pattern 26 may enable electrical connection between the chip 12, circuit board, and an external circuit board. Thus, by selectively forming photoresist 36 on the surface of the first carrier 42 to form an intaglio pattern corresponding to the circuit pattern 26 and bump pad 23 forming region, the circuit layer 24 and circuit pattern 26 may be formed at the same time.

When the intaglio pattern corresponding to the circuit pattern 26 and bump pad 23 forming region is formed, a conductive material may be filled in the intaglio pattern. A method apparent to those skilled in the art may be used for filling in the conductive material, such as plating by electroless plating and/or electroplating, filling with conductive paste, filling with conductive ink by inkjet printing, and filling by polymerizing a conductive polymer, etc. For the conductive material filled in the intaglio pattern, a conductive material known to those skilled in the art may be used, such as aluminum (Al), silver (Ag), copper (Cu), and chromium (Cr), etc.

In this embodiment, the first carrier 42 having a seed layer 38 formed thereon is used in performing copper (Cu) electroplating, with the seed layer 38 as the electrode, to fill the conductive material of copper (Cu) in the intaglio pattern. If the first carrier 42 is made of an insulating resin, etc., it is also possible to fill the intaglio pattern with conductive material by first performing electroless plating to form a seed layer 38 and then using this as the electrode to perform electroplating. Later, when the conductive material is filled in, the photoresist 36 may be removed.

By way of the procedures described above, a first carrier 42 may be manufactured that has bump pads 23 and a circuit pattern 26 formed on its surface in relievo.

FIG. 11, FIG. 12, FIG. 13, FIG. 14 and FIG. 15 represent a flow diagram illustrating a process of manufacturing a circuit board according to an embodiment of the invention. In FIG. 11 to FIG. 15 are illustrated solder pads 20, metal film 22, a circuit layer 24, board pads 30, seed layers 38, circuit patterns 26, a first carrier 42, an insulator 16, a second carrier 44, vias 28, and solder resist 34.

This embodiment illustrates a process of forming the bump pads 23 and circuit pattern 26 on one surface of the insulator 16 and forming the board pads 30 and circuit pattern 26 on the other surface of the insulator 16 with a single pressing. Of course, it is possible to transcribe the bump pads 23 and circuit pattern on one surface of the insulator 16 and afterwards transcribe the board pads 30 and circuit pattern 26 on the other surface in order.

Moreover, it is also possible to transcribe the bump pads 23 and circuit pattern 26 on just one surface of the insulator 16. In this case, a pressing carrier (not shown) may be placed at the other surface of the insulator 16 to apply an equal amount of pressure.

Figure 11:
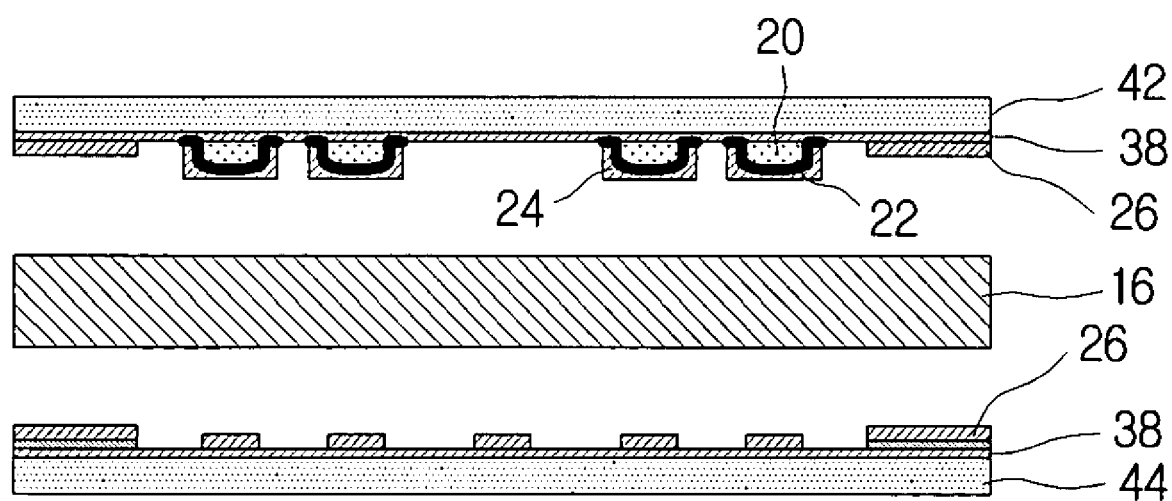
FIG. 11, FIG. 12, FIG. 13, FIG. 14 and FIG. 15 represent a flow diagram illustrating a process of manufacturing a circuit board according to an embodiment of the invention.
Figure 12:
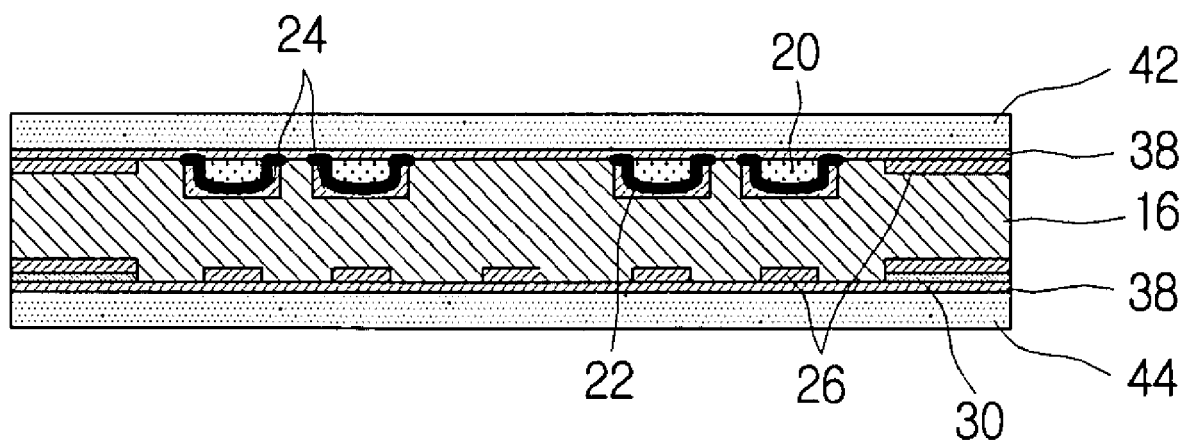

First, as illustrated in FIG. 11 and FIG. 12, the first carrier 42 may be prepared which has the bump pads 23 and circuit pattern 26 formed on one surface in relievo, according to a method described above.

Next, the board pads 30 may be formed, by selectively forming photoresist on a surface of the second carrier 44 to form an intaglio pattern corresponding to a board pad 30 forming region, filling the intaglio pattern with a conductive material including at least one of nickel (Ni), gold (Au), aluminum (Al), and copper (Cu), and removing the photoresist. When the board pads 30 are formed, photoresist may be selectively formed on the surface of the second carrier 44 that is in correspondence with the circuit pattern 26 to be formed on the other surface of the insulator 16, the intaglio pattern may be filled in with conductive material, and then the photoresist may be removed, to prepare the second carrier 44 that has the board pads 30 and circuit pattern 26 formed on its surface in relievo.

Next, the surface of the first carrier 42 on which the bump pads 23 and circuit pattern 26 are formed, and the surface of the second carrier 44 on which the board pads 30 and circuit pattern 26 are formed, may be made to face either surface of the insulator 16. After the first carrier 42, insulator 16, and second carrier 44 are pressed together, the first carrier 42 and second carrier 44 may be removed, to result in the bump pads 23, board pads 30, and circuit patterns 26 buried and transcribed into the insulator 16.

Figure 13:
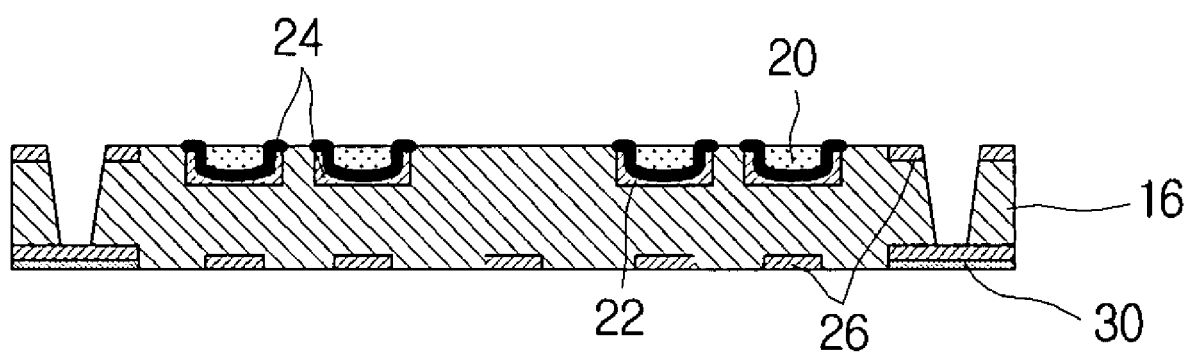

If a carrier is used on which a seed layer 38 is formed, as illustrated in FIG. 13, a leveling operation may be performed, such as by etching one or both surfaces of the insulator 16 or by chemical mechanical polishing (CMP), to remove the seed layer 38 and level the circuit board.

The insulator 16 may include at least one of thermoplastic resin and glass epoxy resin, and when the bump pads 23, board pads 30, and circuit patterns 26 are being transcribed into the insulator 16, the insulator 16 may be in a softened state. That is, after softening the insulator 16 by raising the temperature to the softening temperature of the thermoplastic and/or glass epoxy resin, burying in the softened insulator 16 the bump pads 23, board pads 30, and circuit patterns 26 that are formed in relievo on the first and second carriers 42, 44, and then separating or removing the first and second carriers 42, 44, the circuit board may be manufactured, when the insulator 16 is cured, that has the bump pads 23, board pads 30, and circuit patterns 26 in a buried form.

Here, it is also possible to use prepreg for the insulator 16, in which thermosetting resin is impregnated in glass fibers to provide a semi-cured state.

Figure 14:
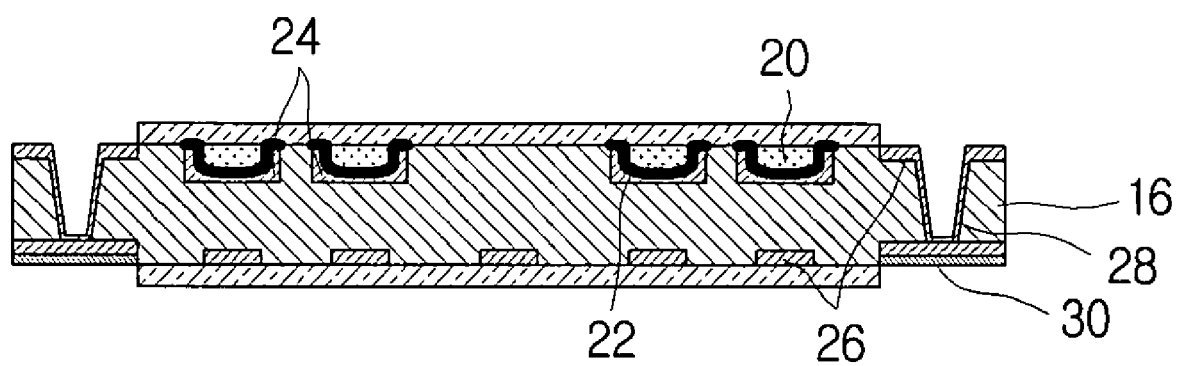
Figure 15:
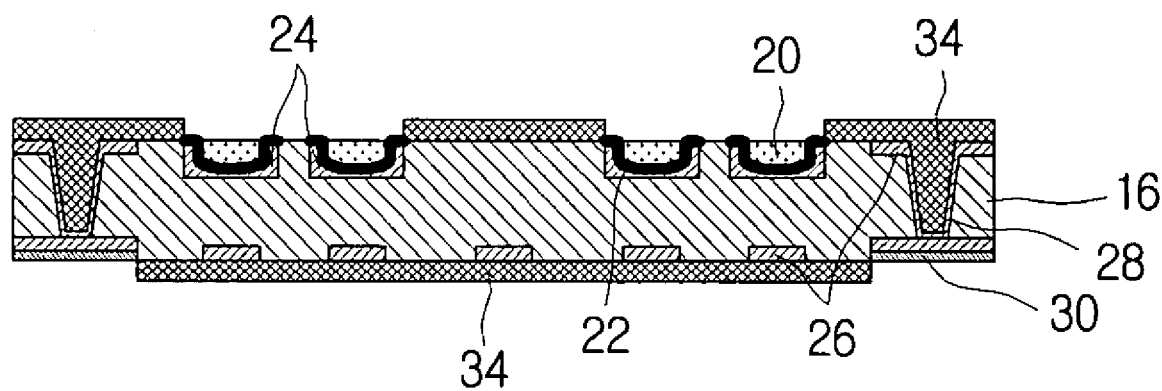

Afterwards, as illustrated in FIG. 14 and FIG. 15, vias 28 may be formed for electrical interconnection between one and the other surfaces of the insulator, and solder resist 34 may be coated for protecting the board surface and preventing solder bridges, to manufacture a circuit board having buried bump pads 23, board pads 30, and circuit patterns 26.

FIG. 16 is a flowchart illustrating a method of manufacturing a circuit board according to an embodiment of the invention. Referring to FIG. 16, in operation S100, solder pads may be formed on a surface of a first carrier. The process of forming the solder pads on the surface of the first carrier may be by selectively forming photoresist on a surface of the first carrier to form an intaglio pattern corresponding with the solder pads, filling solder paste in the intaglio pattern, reflowing the solder paste, and then removing the photoresist.

The method of selectively forming photoresist on a surface of the first carrier to form an intaglio pattern may include first applying photosensitive material on a surface of the first carrier using existing equipment, fabricating a photomask in correspondence with the solder pad region within the multiple bump pads on which the solder bumps are to be mounted, and afterwards stacking the photomask on the surface of the first carrier coated with photosensitive material and then exposing to ultraviolet rays. After the exposure, when the non-cured portions of the photosensitive material are developed with developing liquid, an intaglio pattern may be formed that is in correspondence with the solder pad forming region on the surface of the first carrier. The cured photosensitive material that is not removed by the developing liquid may become the photoresist (S110).

When the intaglio pattern is formed on the first carrier, solder paste may be filled in the intaglio pattern. For filling solder paste in the intaglio pattern, any method apparent to those skilled in the art may be used, such as filling in solder paste using a blade, and filling in solder paste ink using inkjet printing, etc. The solder paste filled in the intaglio pattern may be made of the same material as that of the solder bumps, and may include at least one of lead (Pb), gold (Au), and silver (Ag) (S120).

When the solder paste is filled in, a reflow process may be performed for curing the solder paste. Here, the solder paste may have a round form at the upper surface, due to surface tension (S130). When the photoresist is removed after the reflow process (S140), the solder pads may be completed on the surface of the first carrier.

In operation S200, a metal film is formed which covers the solder pads and extends to the region corresponding to the bump pads.

The metal film may be formed by selectively forming photoresist on the first carrier, on which the solder pads are formed, to form an intaglio pattern that is in correspondence with the bump pad forming region, forming the metal film in the intaglio pattern, and then removing the photoresist.

The metal film may be formed such that covers the solder pads, between the solder pad forming region and the bump pad forming region. To this end, an intaglio pattern may be formed, which is greater than the intaglio pattern for forming the solder pads, on the surface of the first carrier where the solder pads are formed.

The photoresist may be formed on the surface of the first carrier to form an intaglio pattern corresponding to the bump pad forming region (S210). When the intaglio pattern is formed, the metal film may be formed for protecting the solder pads as well as for improving adhesion with the circuit pattern that is to be formed later. In this embodiment, gold (Au) plating was performed to form the metal film. To perform the gold (Au) plating, a process of forming a seed layer on the surface of the first carrier may be performed before forming the solder pads, and gold (Au) electroplating may be performed using this seed layer as an electrode.

By forming the metal film after forming the intaglio pattern corresponding to the bump pad forming region, the metal film may be formed which covers the already formed solder pads and which exists between the solder pad forming region and the bump pad forming region (S220).

Next, the photoresist used for forming the intaglio pattern corresponding to the bump pad forming region may be removed (S230).

In operation S300, a circuit pattern and a circuit layer electrically connected with the metal film may be formed on the surface of the first carrier. The circuit layer and circuit pattern may be formed by selectively forming photoresist on the surface of the first carrier where the solder pads and metal film are formed to form an intaglio pattern corresponding to the circuit pattern and bump pad forming region, filling the intaglio pattern with conductive material, and then removing the photoresist.

The circuit layer may be included in the circuit pattern. That is, the circuit layer may be a part of the circuit pattern formed at the lower portion of the bump pads, where the circuit pattern may enable electrical connection between the chip, circuit board, and an external circuit board. Thus, by selectively forming photoresist on the surface of the first carrier to form an intaglio pattern corresponding to the circuit pattern and bump pad forming region, the circuit layer and circuit pattern may be formed at the same time (S310).

When the intaglio pattern corresponding to the circuit pattern and bump pad forming region is formed, a conductive material may be filled in the intaglio pattern. In this embodiment, copper (Cu) electroplating is performed using a first carrier having a seed layer formed thereon, with the seed layer as the electrode, to fill the conductive material of copper (Cu) in the intaglio pattern. If the first carrier is made of an insulating resin, etc., it is also possible to fill the intaglio pattern with conductive material by first performing electroless plating to form a seed layer and then using this as the electrode to perform electroplating (S320). Later, when the conductive material is filled in, the photoresist may be removed (S330). By way of the procedures described above, a first carrier may be manufactured that has bump pads and a circuit pattern formed on its surface in relievo.

In operation S400, if the bump pads and circuit pattern are transcribed only on one surface of the insulator, the first carrier and the insulator are pressed such that one surface of the first carrier and the insulator face each other.

The insulator may include at least one of thermoplastic resin and glass epoxy resin, and when the bump pads and circuit pattern are being transcribed into the insulator, the insulator may be in a softened state. That is, after softening the insulator by raising the temperature to the softening temperature of thermoplastic and/or glass epoxy resin, the bump pads and circuit pattern that are formed in relievo on the first carrier may be buried in the softened insulator. It is also possible, however, to use prepreg as the insulator, in which thermosetting resin is impregnated in glass fibers to provide a semi-cured state.

In operation S500, when the first carrier is separated or removed from the insulator and the insulator is cured, the bump pads and circuit pattern are transcribed into the insulator in a buried form.

In operation S600, one surface or both surfaces of the insulator are leveled. In the case that a carrier is used on which a seed layer is formed, the seed layer may be removed by etching one or both surfaces of the insulator or by chemical mechanical polishing (CMP), and the circuit board may be leveled overall by polishing portions on one or both surfaces of the insulator by CMP.

Conversely, in the case of forming the bump pads and circuit pattern on one surface of the insulator and forming the board pads and circuit pattern on the other surface of the insulator with a single pressing, first, the first carrier may be prepared which has the bump pads and circuit pattern formed on one surface in relievo, according to a method described above.

Next, the board pads may be formed, by selectively forming photoresist on a surface of a second carrier to form an intaglio pattern corresponding to a board pad forming region, filling the intaglio pattern with a conductive material including at least one of nickel (Ni), gold (Au), aluminum (Al), and copper (Cu), and removing the photoresist. When the board pads are formed, photoresist may be selectively formed on the surface of the second carrier that is in correspondence with the circuit pattern to be formed on the other surface of the insulator, the intaglio pattern may be filled in with conductive material, and then the photoresist may be removed, to prepare the second carrier that has the board pads and circuit pattern formed on its surface in relievo.

Next, the surface of the first carrier on which the bump pads and circuit pattern are formed, and the surface of the second carrier on which the board pads and circuit pattern are formed, may be made to face either surface of the insulator. After the first carrier, insulator, and second carrier are pressed together, the first carrier and second carrier may be removed, whereby the bump pads, board pads, and circuit patterns may be buried and transcribed into the insulator. In the case that a carrier was used on which a seed layer is formed, a leveling operation may be performed, such as by etching one or both surfaces of the insulator or by chemical mechanical polishing (CMP), to remove the seed layer and level the circuit board.

Afterwards, vias may be formed for electrical interconnection between one surface and the other surface of the insulator, and solder resist may be applied for protecting the board surface and preventing solder bridges, to manufacture a circuit board having buried bump pads, board pads, and circuit patterns.

According to certain aspects of the invention as set forth above, the amount of solder for the contacting of a flip chip can be adjusted, and solder can be filled inside the board, so that after installing a chip, the overall thickness of the package can be reduced. Furthermore, by forming flat bump pads, the lead time for the coining operation may also be reduced.

In addition, a circuit board can be manufactured that has circuits of high density. In a circuit board thus manufactured, the circuits can be formed inside the board, so that the adhesion between the circuits and the board can be increased, leading to less peeling of the circuits, and the overall thickness of the board can be reduced.

Also, as the circuits can be formed inside the board, there can be greater evenness and easier heat release. Moreover, there is less likelihood of bending of the circuit board, and higher reliability with respect to ion migration between adjacent circuits.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a circuit board including at least one bump pad configured to have at least one solder bump placed thereon, the method comprising:
    forming at least one solder pad on a surface of a first carrier;
    forming a metal film on the surface of the first carrier, the metal film covering the solder pad and extending to a bump pad forming region;
    forming a circuit layer and a circuit pattern on the surface of the first carrier, the circuit layer and the circuit pattern being electrically connected with the metal film;
    pressing the first carrier and an insulator such that the surface of the first carrier and the insulator face each other; and
    removing the first carrier.

2. The method of claim 1, further comprising, after the removing the first carrier, leveling the insulator.

3. The method of claim 1, wherein the forming the solder pad comprises:
    selectively forming a photoresist on the surface of the first carrier to form an intaglio pattern corresponding to the solder pad;
    filling a solder paste in the intaglio pattern;
    reflowing the solder paste; and
    removing the photoresist.

4. The method of claim 1, wherein the forming the metal film comprises:
    selectively forming a photoresist on the first carrier to form an intaglio pattern corresponding to the bump pad forming region;
    forming a metal film in the intaglio pattern; and
    removing the photoresist.

5. The method of claim 1, wherein the forming the circuit layer and the circuit pattern comprises:
    selectively forming a photoresist on the surface of the first carrier to form an intaglio pattern corresponding to the circuit pattern and the bump pad forming region;
    filling a solder paste in the intaglio pattern; and
    removing the photoresist.

6. The method of claim 5, wherein the filling the solder paste in the intaglio pattern comprises electroplating.

7. The method of claim 1, wherein:
    the forming the solder pad comprises forming a board pad on a surface of a second carrier,
    the forming the circuit layer and the circuit pattern comprises forming a circuit pattern on the surface of the second carrier, the circuit pattern being electrically connected with the board pad,
    the pressing the first carrier and the insulator comprises pressing the first carrier and the second carrier respectively onto one of first and second surfaces of the insulator such that the surface of the first carrier and the surface of the second carrier respectively face the insulator, and
    the removing the first carrier comprises removing the first carrier and the second carrier.

8. The method of claim 7, further comprising, after the removing the first carrier and the second carrier:
    leveling one of the first and second surfaces of the insulator;
    forming at least one via in the insulator; and
    coating a solder resist on at least one of the first and second surfaces of the insulator.

* * * * *